United States Patent
Hu et al.

(10) Patent No.: US 11,700,729 B2
(45) Date of Patent: Jul. 11, 2023

(54) MEMORY ARRAYS AND METHODS USED IN FORMING A MEMORY ARRAY COMPRISING STRINGS OF MEMORY CELLS

(71) Applicant: Micron Technology, Inc., Boise, ID (US)

(72) Inventors: Yi Hu, Boise, ID (US); Ramey M. Abdelrahaman, Boise, ID (US); Narula Bilik, Boise, ID (US); Daniel Billingsley, Meridian, ID (US); Zhenyu Bo, Boise, ID (US); Joan M. Kash, Meridian, ID (US); Matthew J. King, Boise, ID (US); Andrew Li, Boise, ID (US); David Neumeyer, Boise, ID (US); Wei Yeeng Ng, Boise, ID (US); Yung K. Pak, Oasis, ID (US); Chandra Tiwari, Boise, ID (US); Yiping Wang, Boise, ID (US); Lance Williamson, Boise, ID (US); Xiaosong Zhang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/524,913

(22) Filed: Nov. 12, 2021

(65) Prior Publication Data
US 2022/0077169 A1 Mar. 10, 2022

Related U.S. Application Data

(62) Division of application No. 16/550,238, filed on Aug. 25, 2019, now Pat. No. 11,205,654.

(51) Int. Cl.
*H10B 41/27* (2023.01)
*H10B 41/35* (2023.01)
*H10B 43/27* (2023.01)
*H10B 43/35* (2023.01)

(52) U.S. Cl.
CPC ............. *H10B 41/27* (2023.02); *H10B 41/35* (2023.02); *H10B 43/27* (2023.02); *H10B 43/35* (2023.02)

(58) Field of Classification Search
CPC ........ H10N 43/27; H10N 43/10; H10N 43/35; H10N 41/27; H10N 41/10; H10N 43/20
See application file for complete search history.

(56) References Cited

U.S. PATENT DOCUMENTS

| 9,997,353 B1 | 6/2018 | Kumar et al. |
| 10,290,643 B1 | 5/2019 | Kai |
| 2008/0014761 A1 | 1/2008 | Bhatia |

(Continued)

*Primary Examiner* — Xiaoming Liu
(74) *Attorney, Agent, or Firm* — Weils St. John P.S.

(57) ABSTRACT

A memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Intervening material is laterally-between and longitudinally-along immediately-laterally-adjacent of the memory blocks. The intervening material comprises longitudinally-alternating first and second regions that individually have a vertically-elongated seam therein. The vertically-elongated seam in the first regions are taller than in the second regions. Additional embodiments, including method, are disclosed.

20 Claims, 22 Drawing Sheets

(56) References Cited

U.S. PATENT DOCUMENTS

| | | |
|---|---|---|
| 2012/0119287 A1 | 5/2012 | Park et al. |
| 2012/0168829 A1 | 7/2012 | Zhong et al. |
| 2012/0208347 A1 | 8/2012 | Hwang et al. |
| 2015/0206900 A1 | 7/2015 | Nam et al. |
| 2015/0303214 A1 | 10/2015 | Kim et al. |
| 2016/0049421 A1 | 2/2016 | Zhang et al. |
| 2017/0250193 A1 | 8/2017 | Huo |
| 2017/0256645 A1 | 9/2017 | Chung et al. |
| 2018/0261616 A1 | 9/2018 | Cho et al. |
| 2019/0019724 A1 | 1/2019 | Cheng et al. |
| 2020/0312863 A1 | 10/2020 | Iwai et al. |
| 2021/0202324 A1 | 7/2021 | Scarbrough et al. |

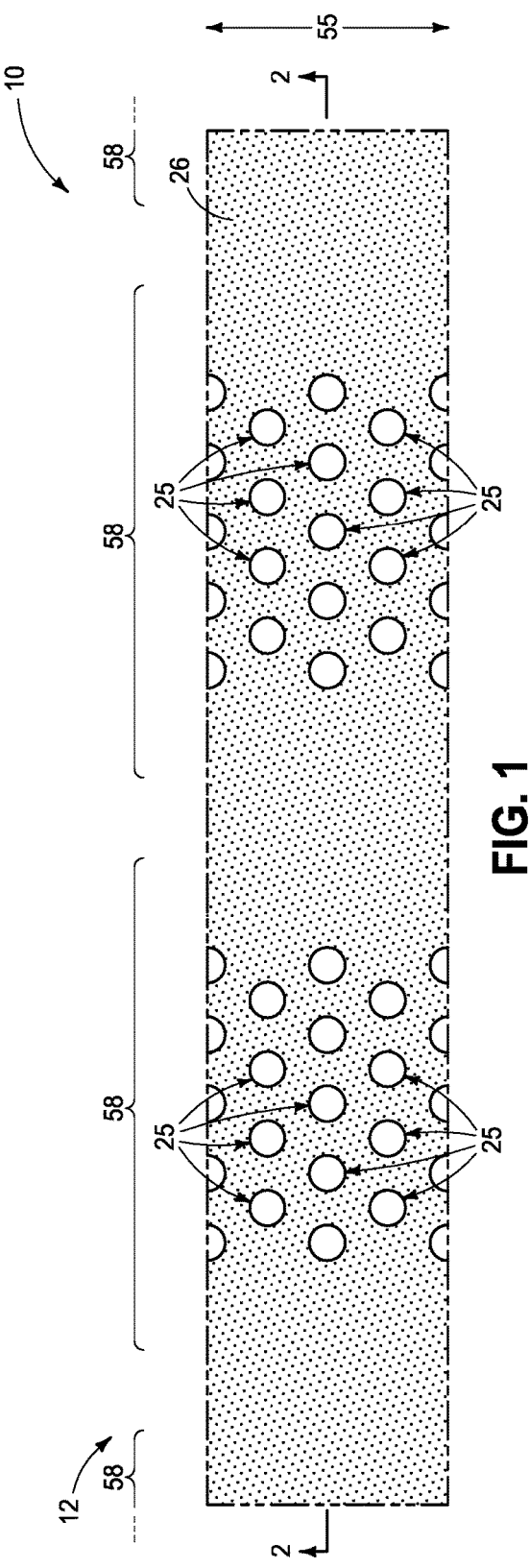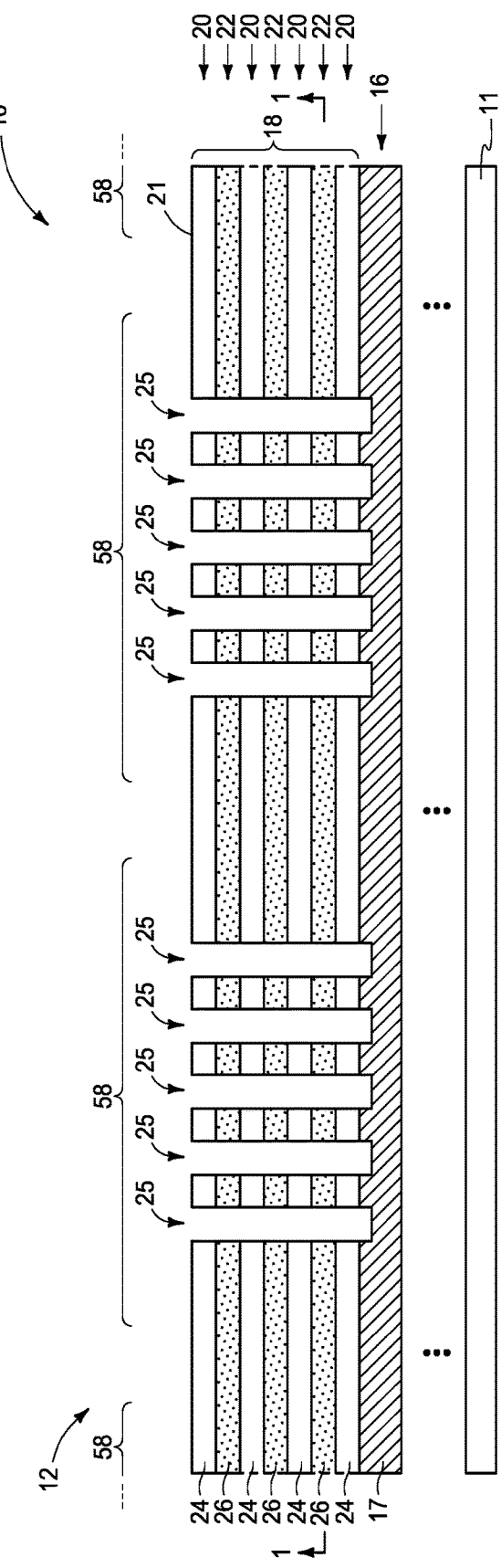

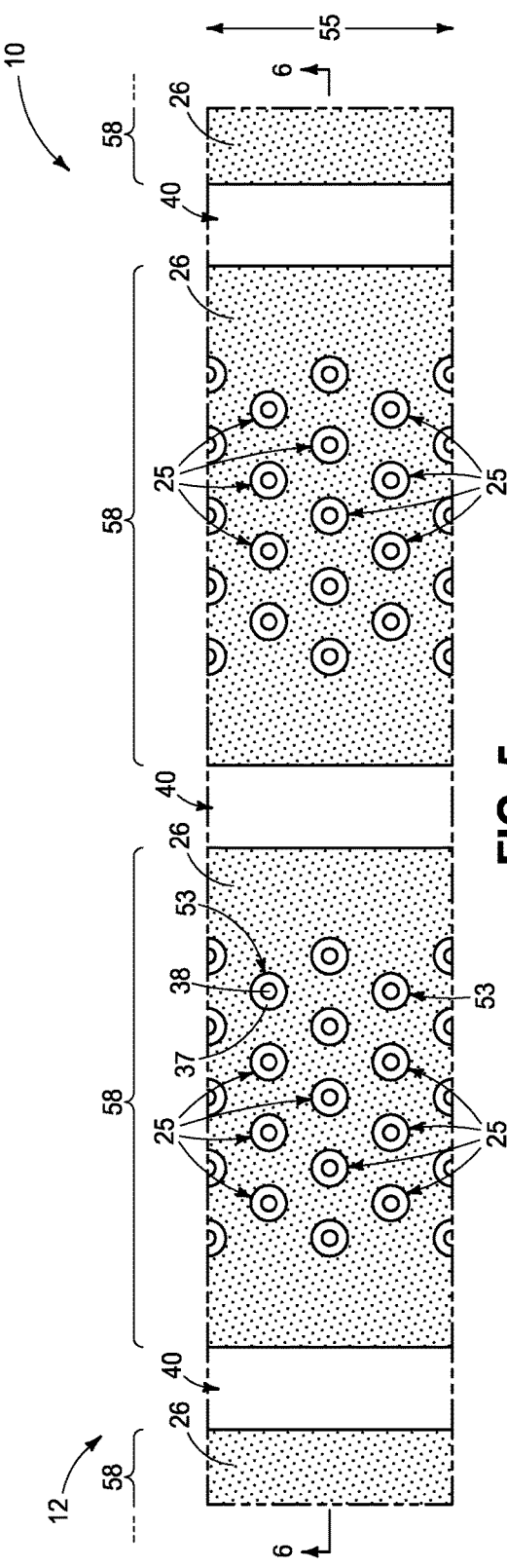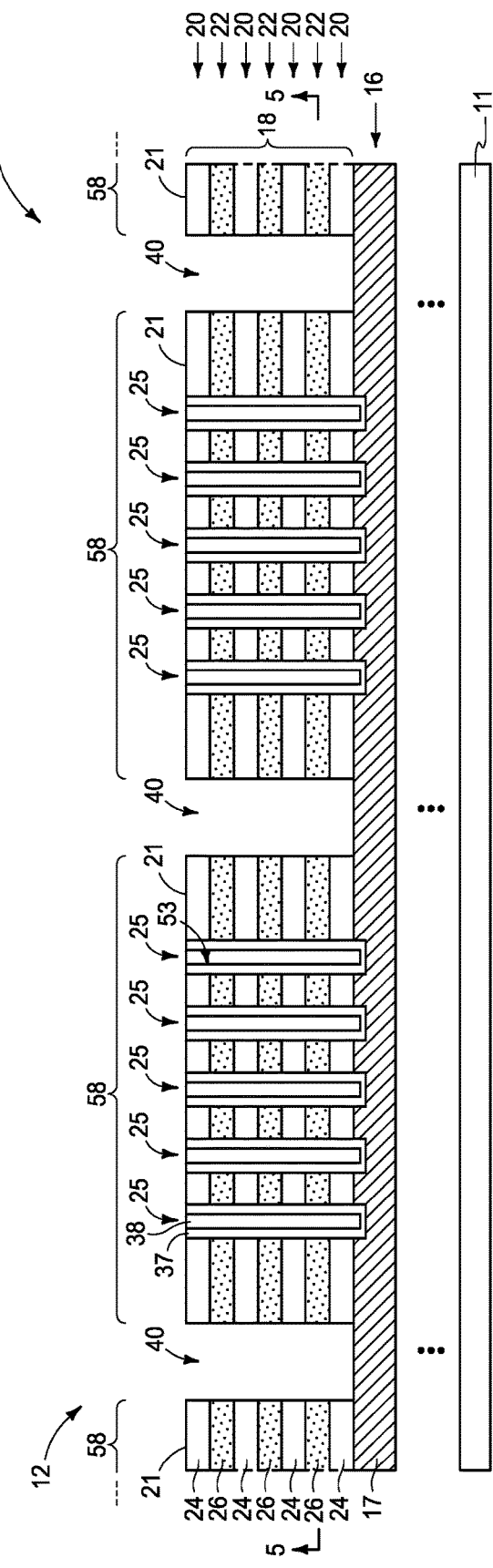

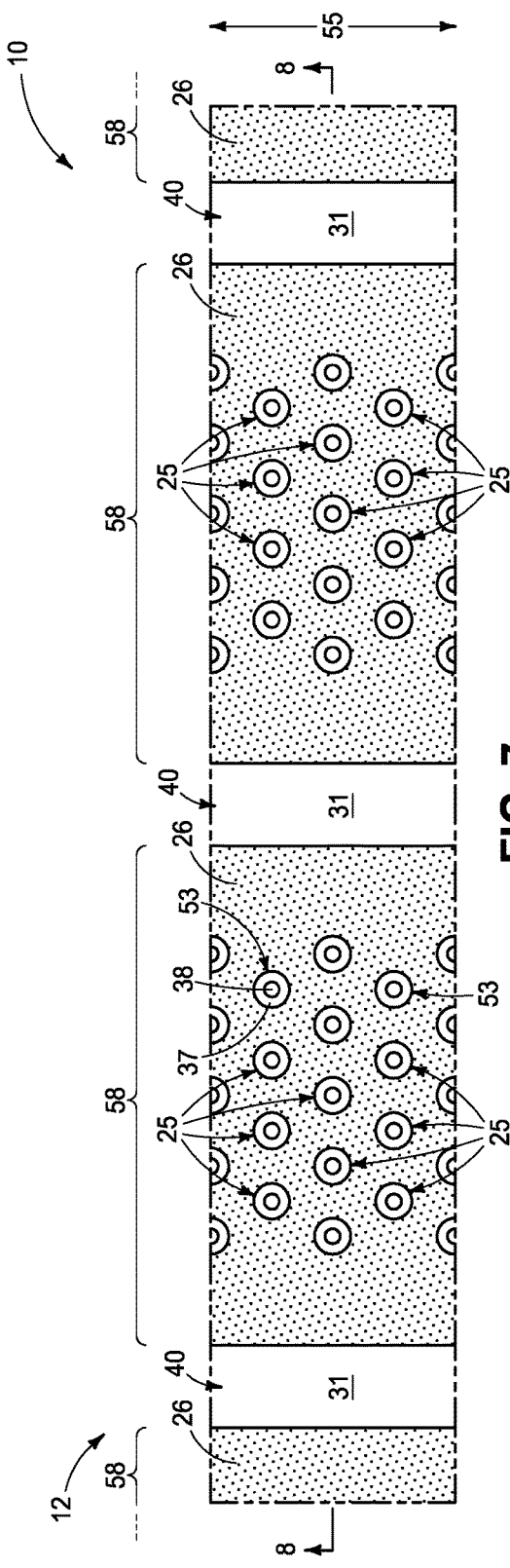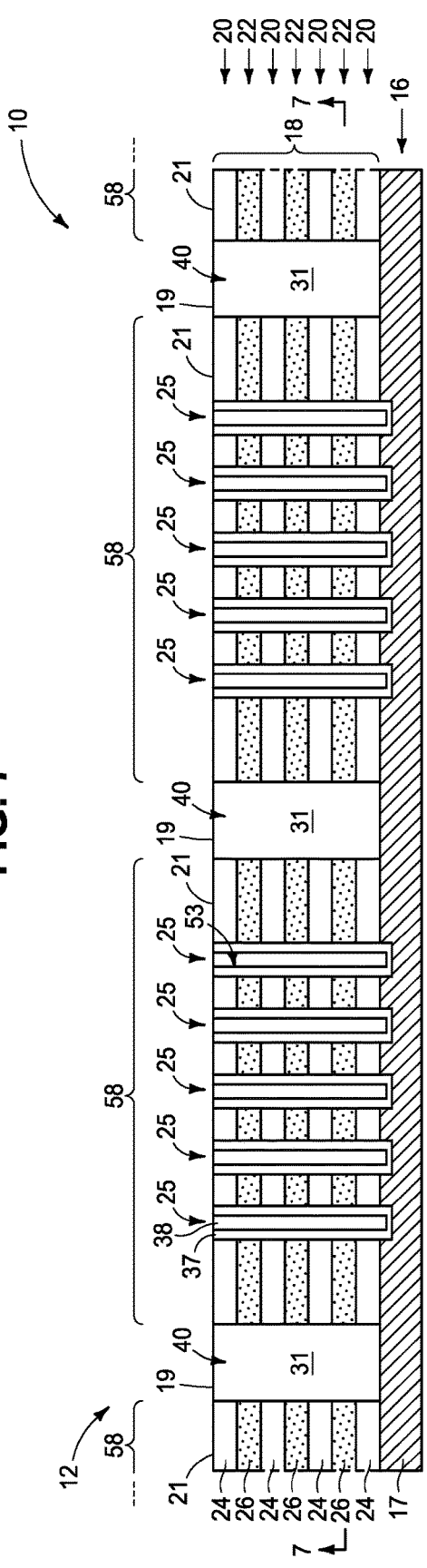

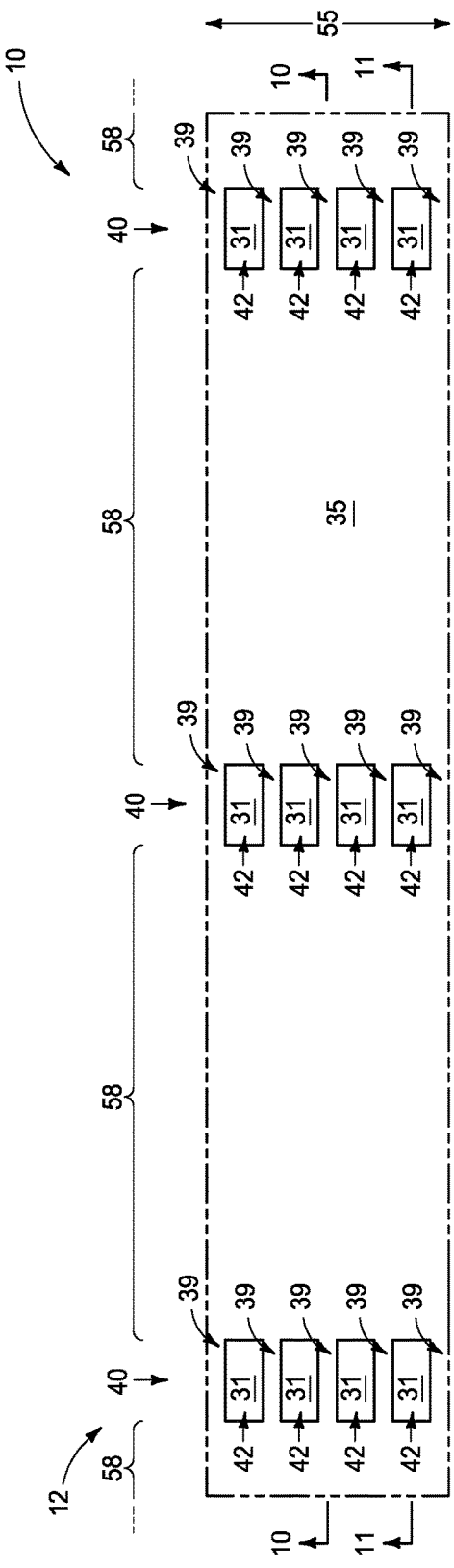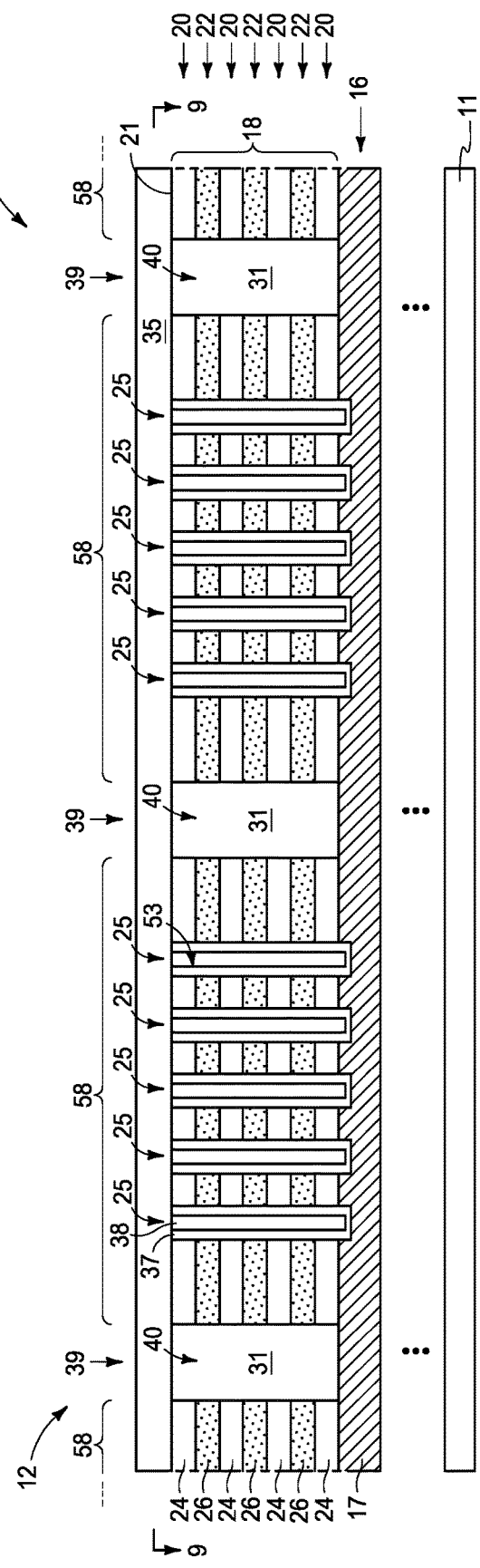

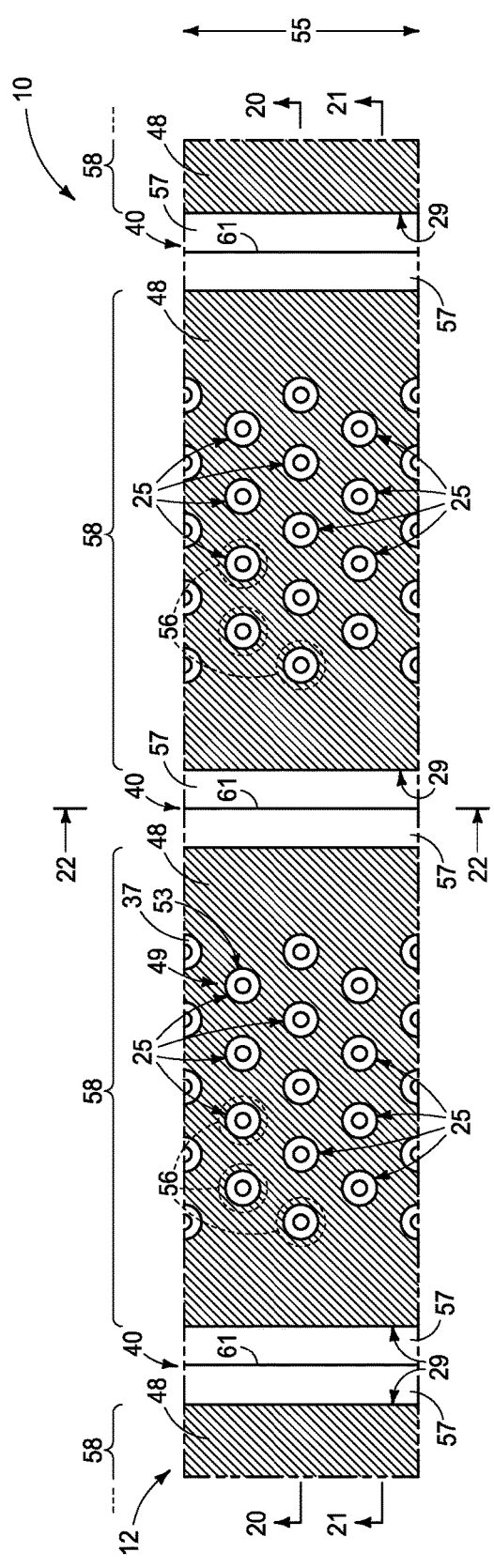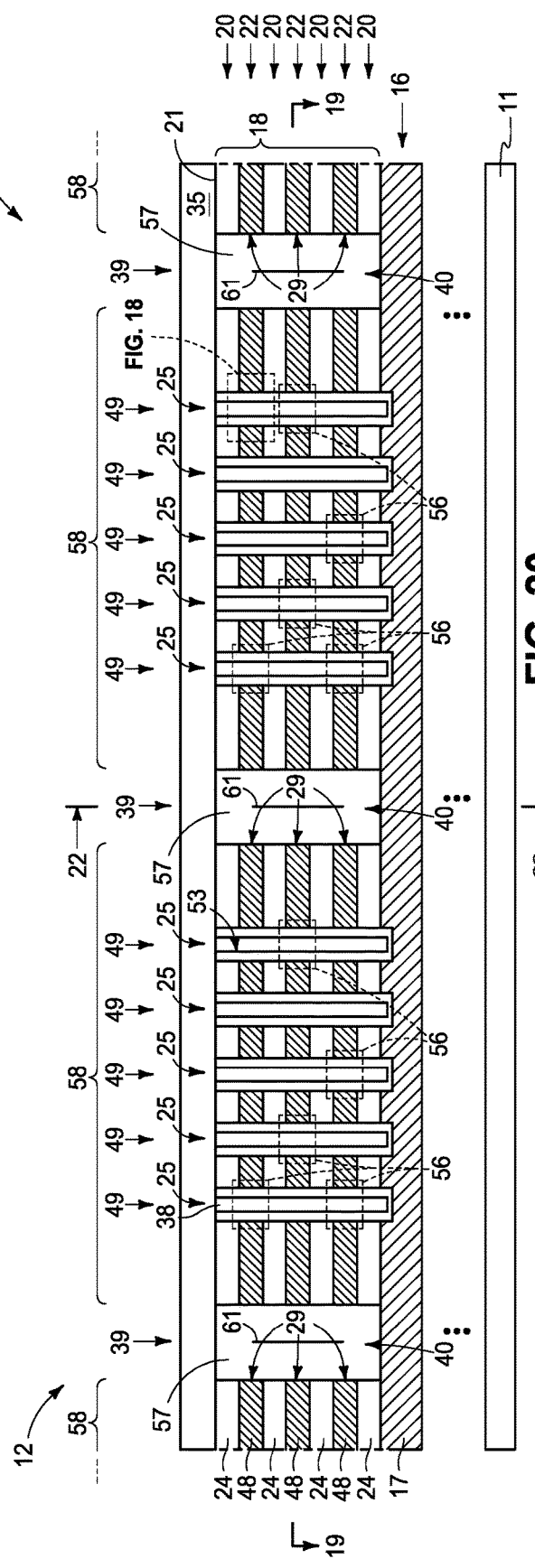
FIG. 19
FIG. 20

MEMORY ARRAYS AND METHODS USED IN FORMING A MEMORY ARRAY COMPRISING STRINGS OF MEMORY CELLS

This patent resulted from a divisional application of U.S. patent application Ser. No. 16/550,238, filed Aug. 25, 2019, entitled "Memory Arrays And Methods Used In Forming A Memory Array Comprising Strings Of Memory Cells", naming Yi Hu, Ramey M. Abdelrahaman, Narula Bilik, Daniel Billingsley, Zhenyu Bo, Joan M. Kash, Matthew J. King, Andrew Li, David Neumeyer, Wei Yeeng Ng, Yung K. Pak, Chandra Tiwari, Yiping Wang, Lance Williamson, and Xiaosong Zhang as inventors, the disclosure of which is incorporated by reference.

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may, conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833, and which are hereby and herein fully incorporated by reference and aspects of which may be used in some embodiments of the inventions disclosed herein. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3-23, 30, and 31 are diagrammatic sequential sectional and/or enlarged views of the construction of FIGS. 1 and 2, or portions thereof, in process in accordance with some embodiments of the invention.

DETAILED DESCRIPTION OF EXAMPLE EMBODIMENTS

Figure 3:
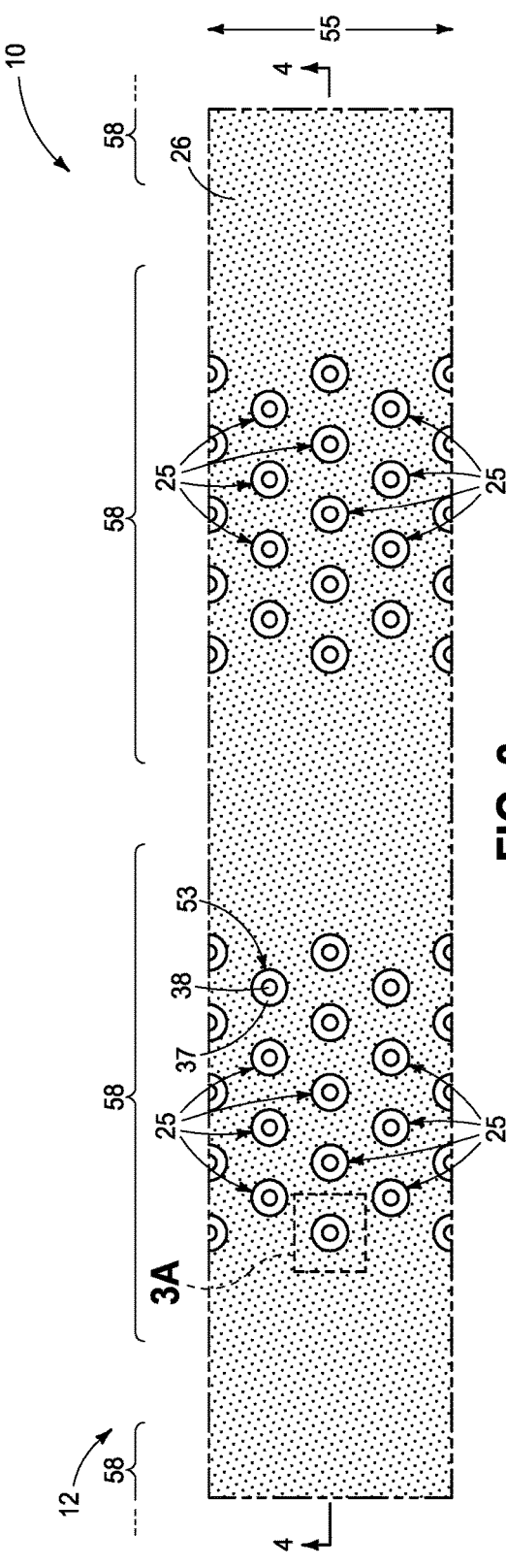
Figure 4:
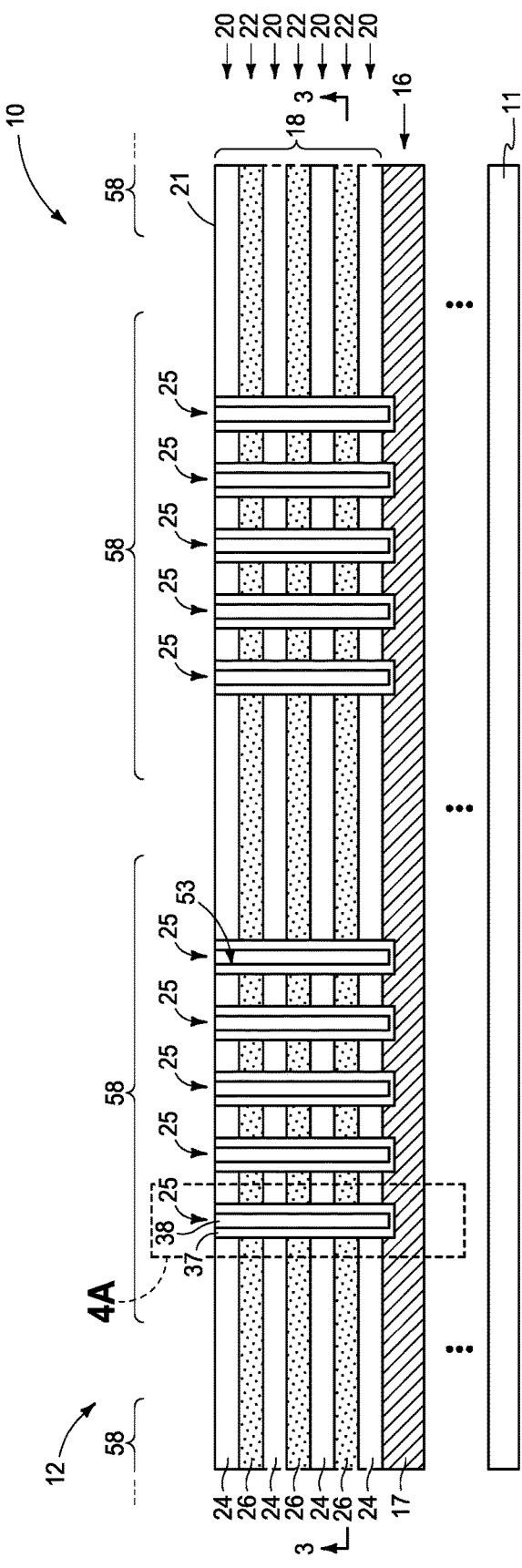
Figure 4A:
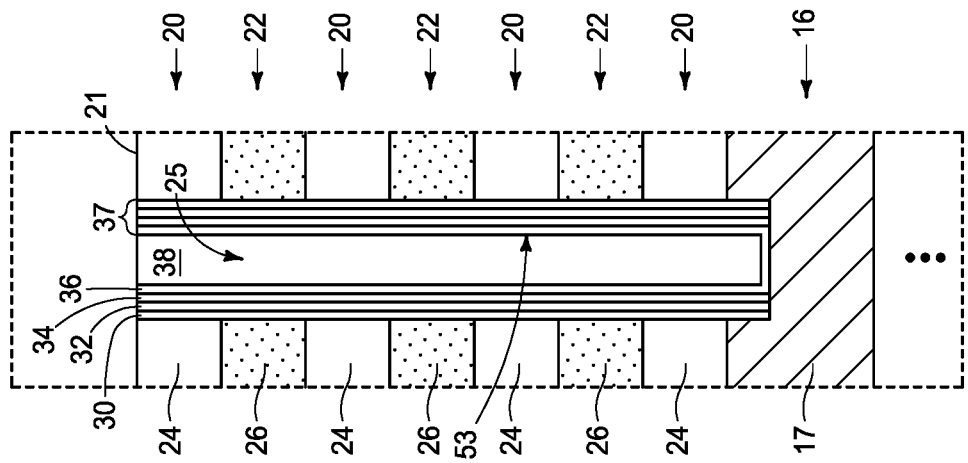
Figure 3A:
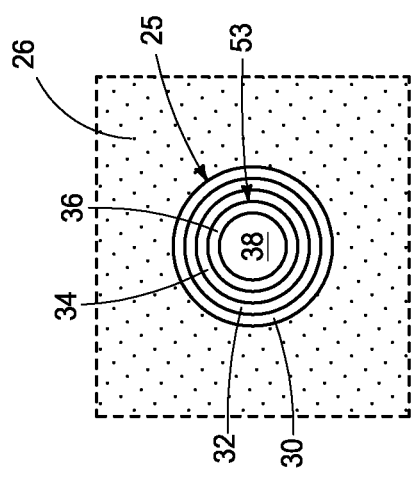

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-23 which may, be considered as a "gate-last" or "replacement-gate" process.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12, A stack 18 comprising vertically-alternating insulative tiers 20 and conductive tiers 22 has been formed above conductor tier 16. Example thickness for each of tiers 20 and 22 is 22 to 60 nanometers, Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Uppermost insulative tier 20 may be considered as having a top surface 21.

Channel openings 25 have been formed (e.g., by etching) through insulative tiers 20 and conductive tiers 22 to conductor tier 16, In some embodiments, channel openings 25 may go partially into conductive material 17 of conductor tier 16 as shown or may stop there-atop (not shown). Alternately, as an example, channel openings 25 may stop atop or within the lowest insulative tier 20, A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 3, 3A, 4, and 4A show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Channel material 36 has also been formed in channel openings 25 elevationally along insulative tiers 20 and conductive tiers 22, thus comprising individual operative channel-material strings 53, Materials 30, 32, 34, and 36 are collectively shown as and only designated as material 37 in FIGS. 3 and 4 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space (s) (not shown) and/or be devoid of solid material (not shown). Conductive plugs (not shown) may be formed atop channel material strings 53 for better conductive connection to overlying circuitry (not shown).

Referring to FIGS. 5 and 6, horizontally-elongated trenches 40 have been formed (e.g., by anisotropic etching) into stack 18 to form laterally-spaced memory-block regions 58. Horizontally-elongated trenches 40 may have respective bottoms that are directly against conductive material 17 (e.g., atop or within) of conductor tier 16 (as shown) or may have respective bottoms that are above conductive material 17 of conductor tier 16 (not shown).

The above processing shows forming and filling channel openings 25 prior to forming trenches 40. Such could be reversed. Alternately, trenches 40 could be formed in between the forming and filling of channel openings 25 (not ideal).

Referring to FIGS. 7 and 8, sacrificial material 31 has been formed in trenches 40. An example technique for doing so includes deposition of sacrificial material 31 to overfill trenches 40, followed by planarizing such back at least to top surface 21 of uppermost insulative tier 20. In some embodiments, such sacrificial material is referred to as second sacrificial material 31, In one embodiment and as shown, sacrificial material 31 is formed to have a top surface 19 that is elevationally coincident with top surface 21 of stack 18. In one embodiment and as shown, top surfaces 19 and 21 are individually planar and collectively are co-planar. Example sacrificial materials include at least one of spin-on-carbon, boron and/or phosphorus doped silicon dioxide, silicon nitride, aluminum oxide, and elemental-form tungsten. In one embodiment, conductive tiers 22 comprise first sacrificial material 26 and sacrificial material 31 comprises a second sacrificial material which in one embodiment are of different compositions relative one another and in another embodiment are of the same composition relative one another.

Figure 11:
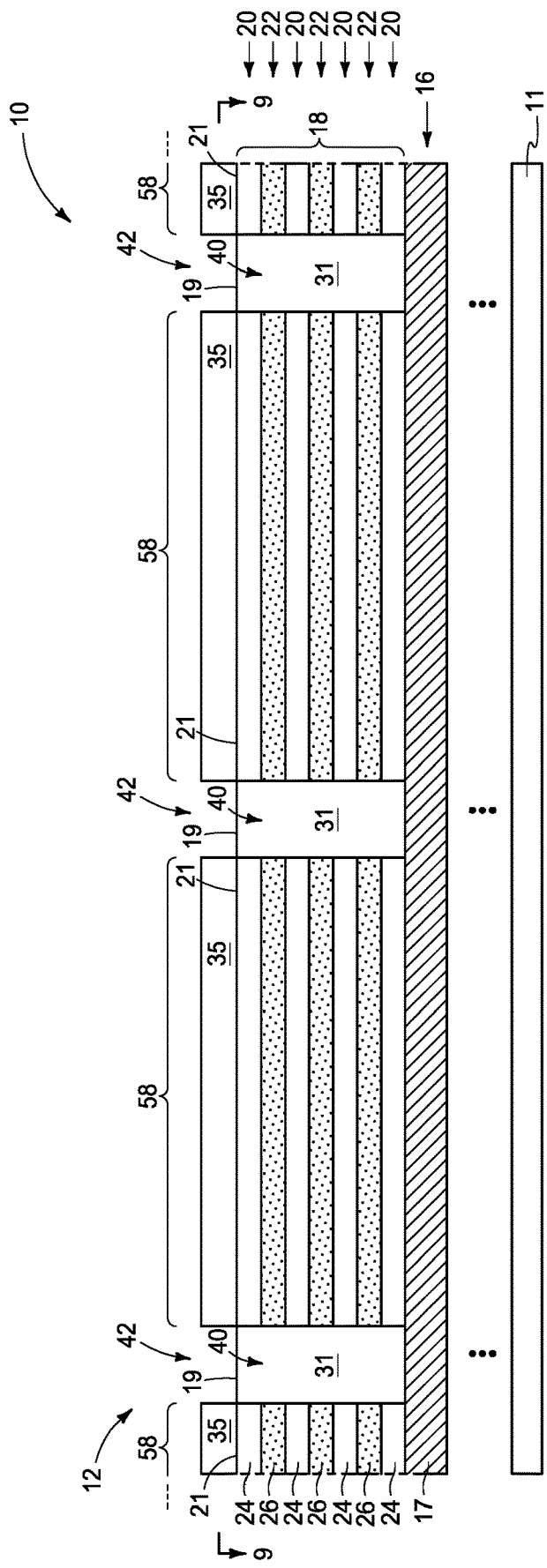

Referring to FIGS. 9-11, bridges 39 have been formed above stack 18 and sacrificial material 31. Bridges 39 extend across trenches 40 laterally-between and longitudinally-spaced-along immediately-laterally-adjacent memory-block regions 58. Spaces 42 are longitudinally-between bridges 39. In one embodiment and as shown, material 35 of bridges 39 is directly against insulative material 24 of top insulative tier 20 of stack 18 and in one such embodiment is of the same composition as insulative material 24 (e.g., silicon dioxide). In another embodiment, bridge material 35 is of different composition of all material (e.g., 24, 26) of vertically-alternating insulative tiers 20 and conductive tiers 22 (regardless of whether being directly against top insulative tier 20 of stack 18), with one example material being carbon-doped silicon nitride. In one embodiment, bridge material 35 is atop and extends laterally all across individual memory-block regions 58, and in one such embodiment as shown covers all of tops (e.g., 21) of memory-block regions 58. An example technique of forming patterned bridge material 35 as shown is photolithographic patterning and etch, with or without pitch multiplication. In embodiments where bridges 39 remain in a finished construction of integrated circuitry, such are formed to at least have outer material thereof be insulative (whereby bridges 39 formed therefrom are thereby insulative).

Figure 12:
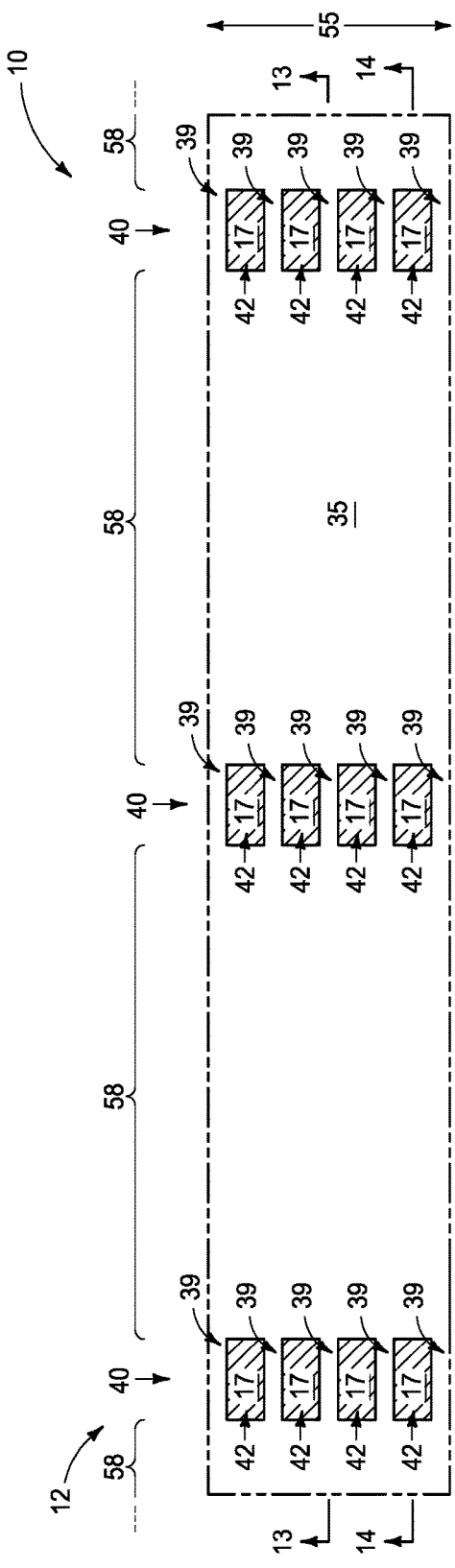
Figure 13:
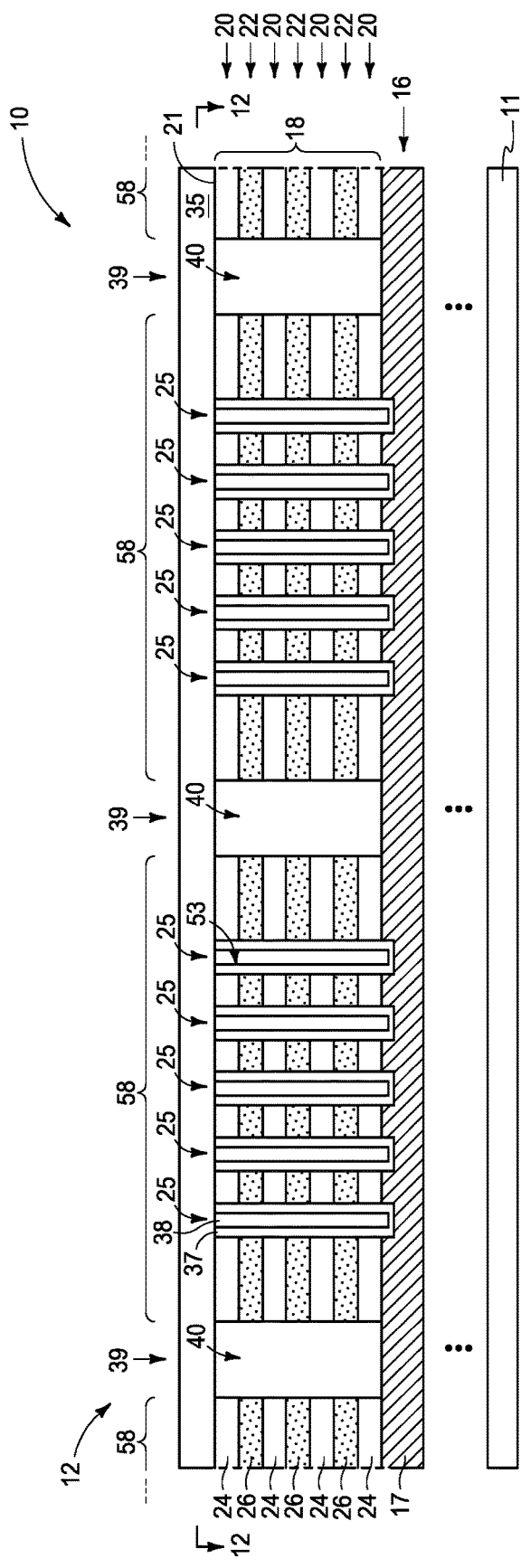
Figure 14:
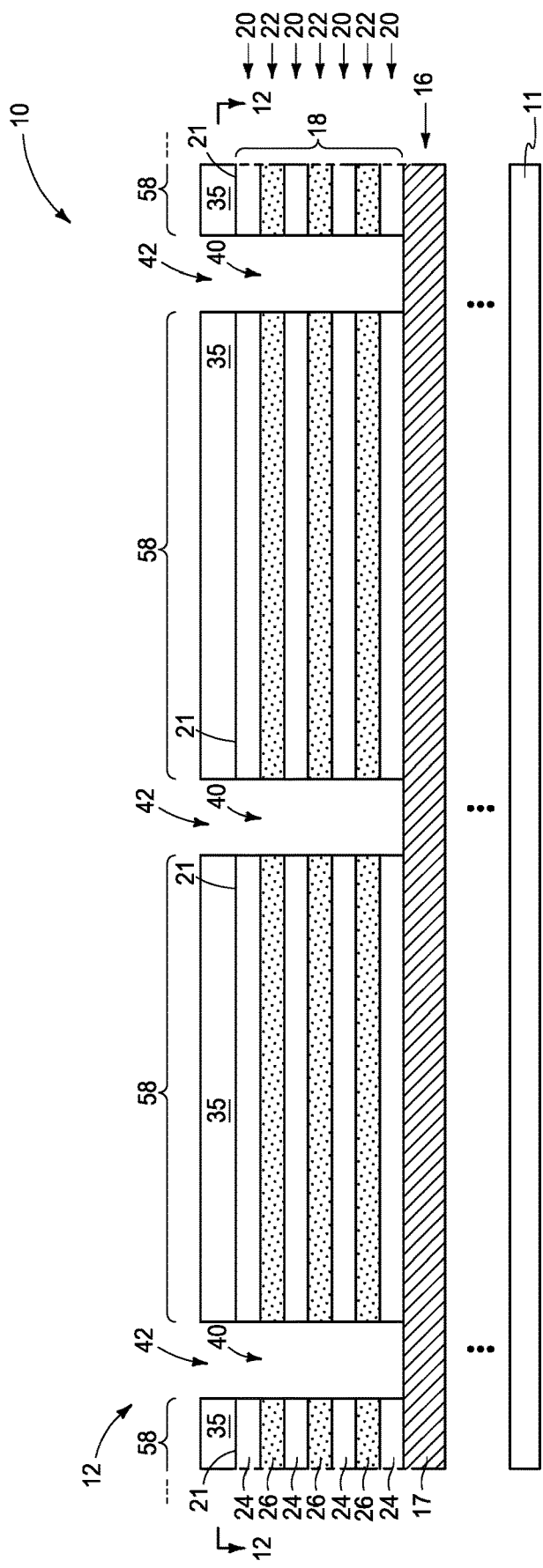
Figure 15:
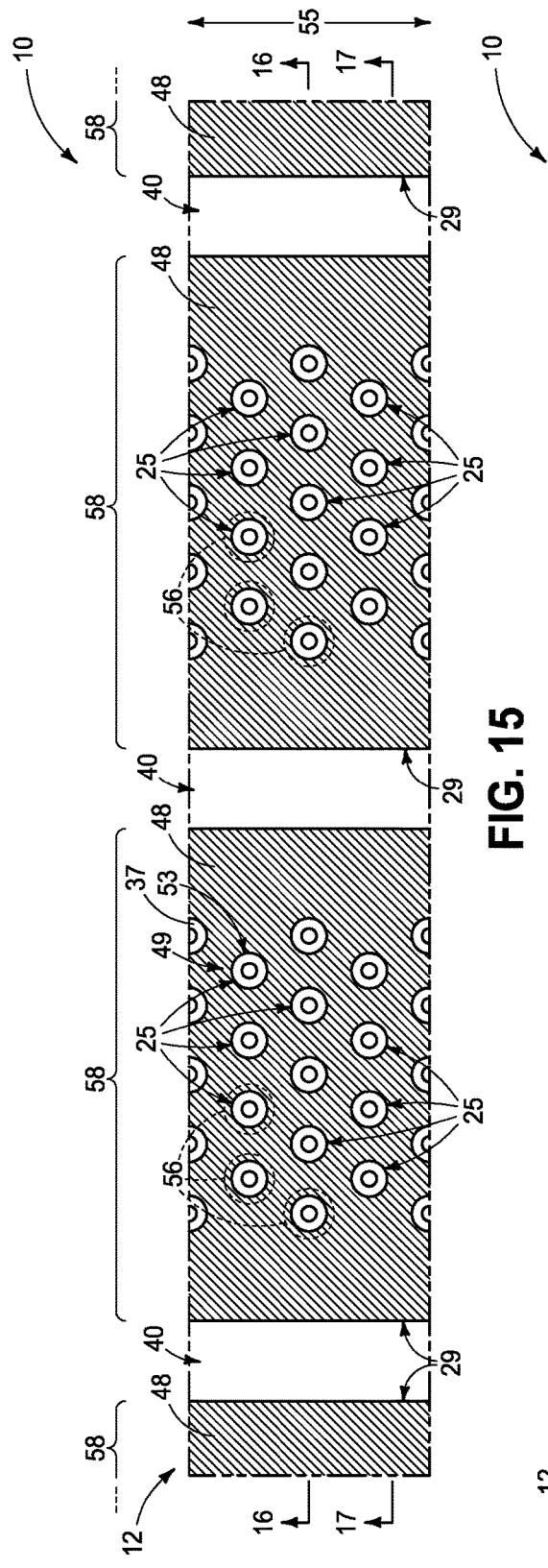
Figure 16:
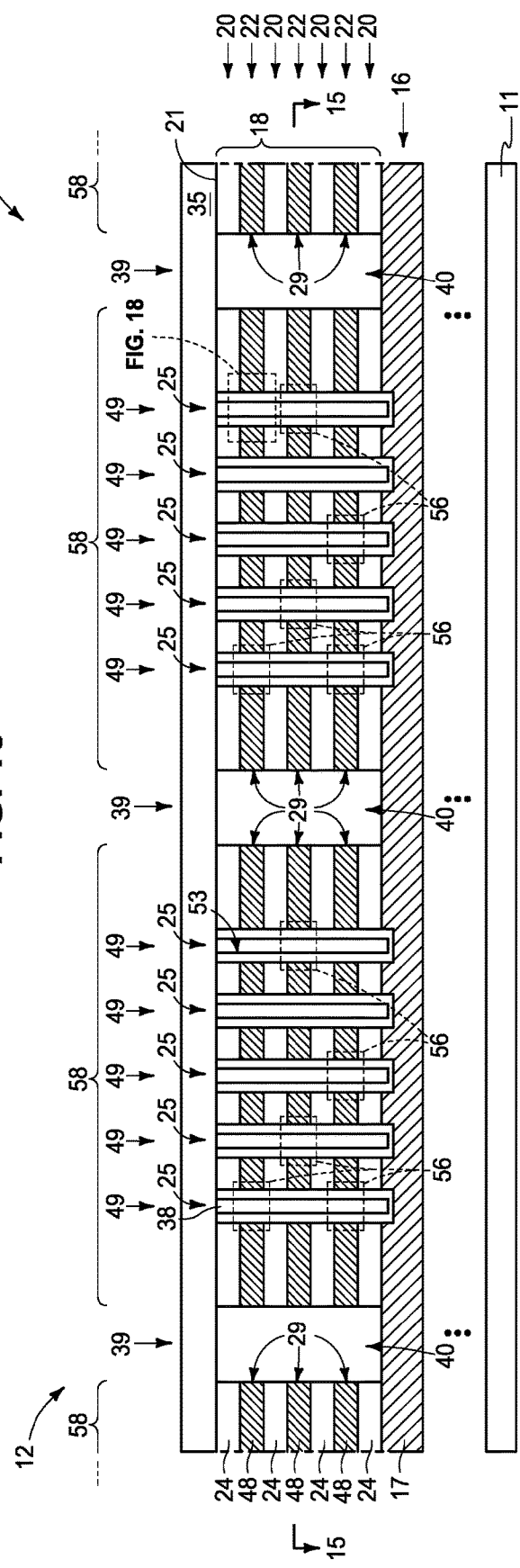
Figure 17:
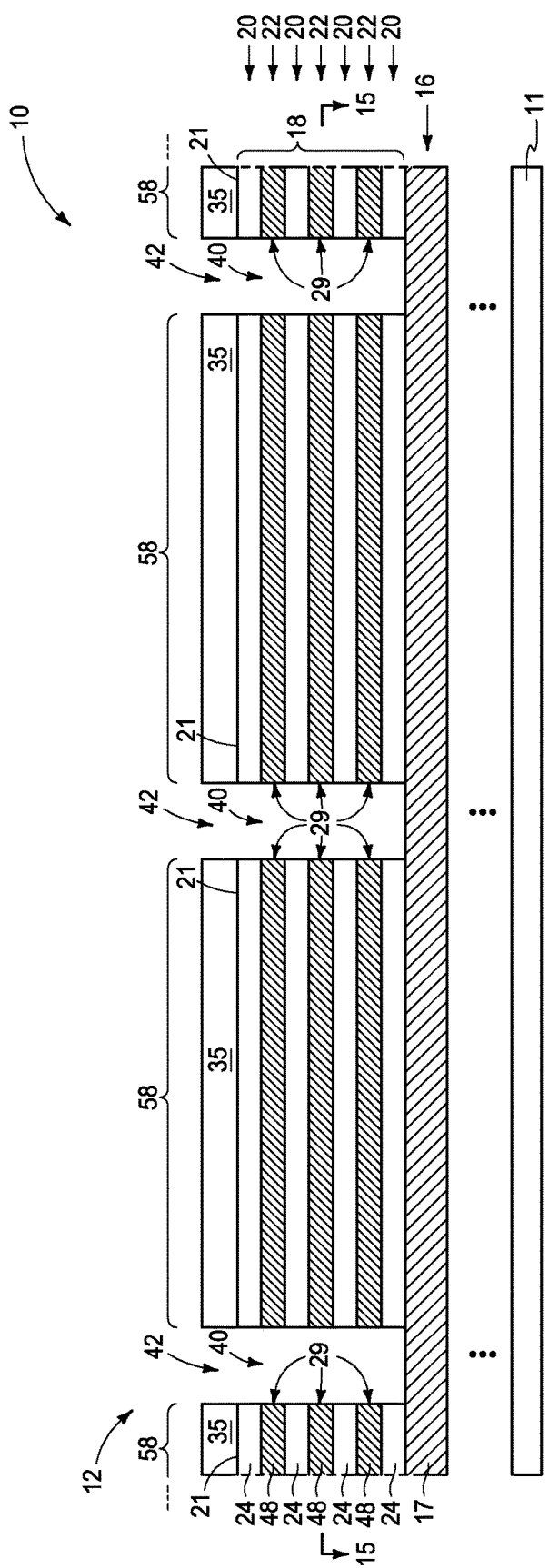
Figure 18:
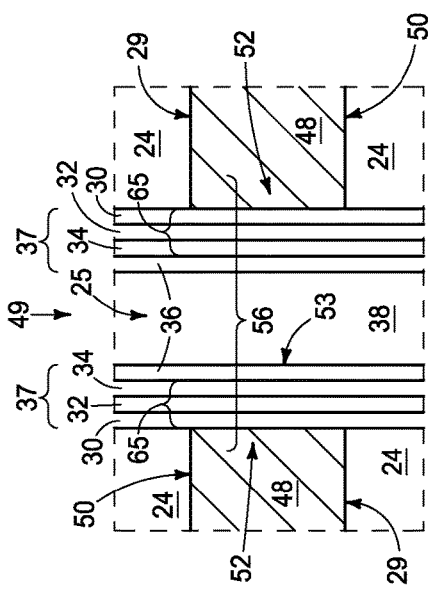
Figure 21:
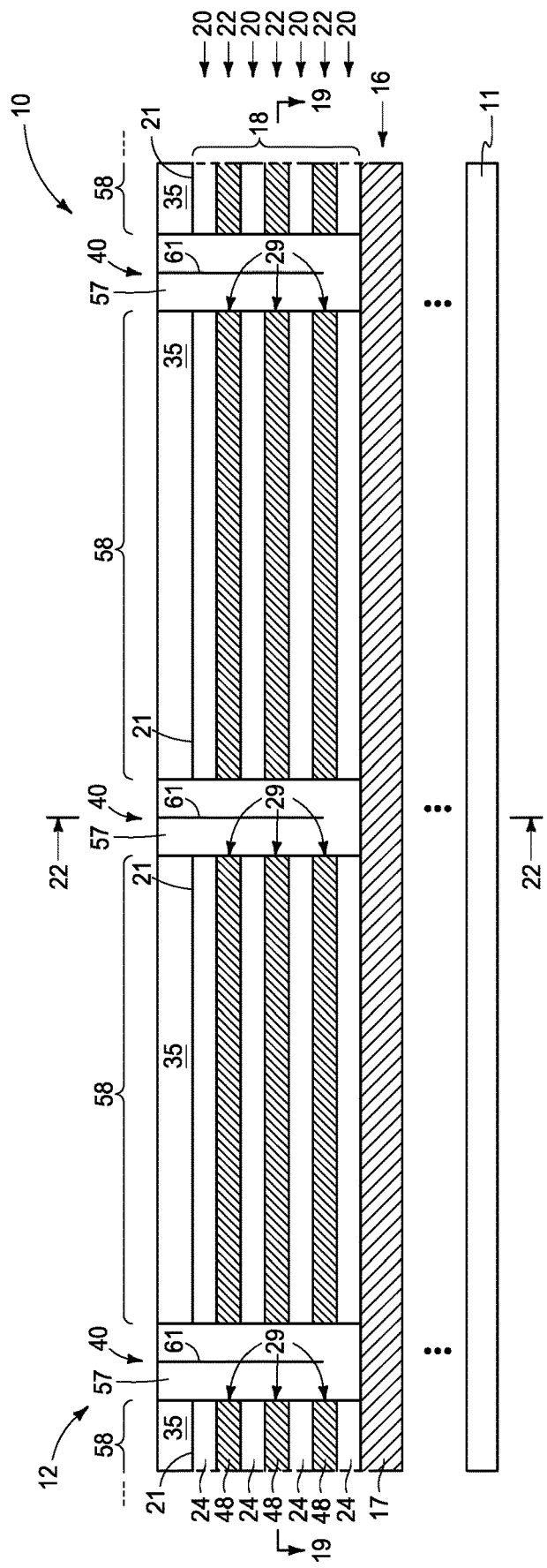

Sacrificial material 31 in trenches 40 is replaced with intervening material that is directly under and longitudinally-between bridges 39. An example such method is described with reference to FIGS. 12-23. Referring first to FIGS. 12-14, sacrificial material 31 (not shown) has been removed, for example by being isotropically etched away selectively relative to bridges 39 and insulative tiers 20, and in one embodiment as shown selectively relative to conductive tiers 22. The artisan is capable of selecting suitable etching chemistries for etching one material selectively relative to other materials.

Referring to FIGS. 15-18, and in one embodiment, material 26 (not shown) of conductive tiers 22 has been removed, for example by being isotropically etched away through spaces 42 ideally selectively relative to the other exposed materials (e.g., using liquid or vapor $H_3PO_4$ as a primary etchant where material 26 is silicon nitride, and other materials comprise one or more oxides or polysilicon), Material 26 (not shown) in conductive tiers 22 in the example embodiment is sacrificial and has been replaced with conducting material 48, and which has thereafter been removed from spaces 42 and trenches 40, thus forming individual conductive lines 29 (e.g., wordlines) and elevationally-extending strings 49 of individual transistors and/or memory cells 56. In one embodiment, material 35 of the bridges is also atop and extends laterally all across individual of memory-block regions 58 during the act of replacing, and in one such embodiment as shown material 35 covers all of tops of memory-block regions 58 during the act of replacing.

A thin insulative liner (e.g., $Al_2O_3$ and not shown) may be formed before forming conducting material 48. Approximate locations of transistors and/or memory cells 56 are indicated with a bracket in FIG. 18 and some with dashed outlines in FIGS. 15 and 16, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 18) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming bridges 39. Alternately, the conducting material of the conductive tiers may be formed before forming upper bridges 39 and/or before forming trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 23:
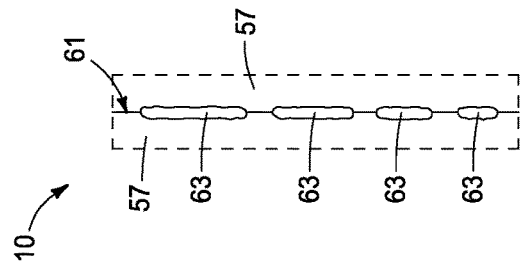
Figure 22:
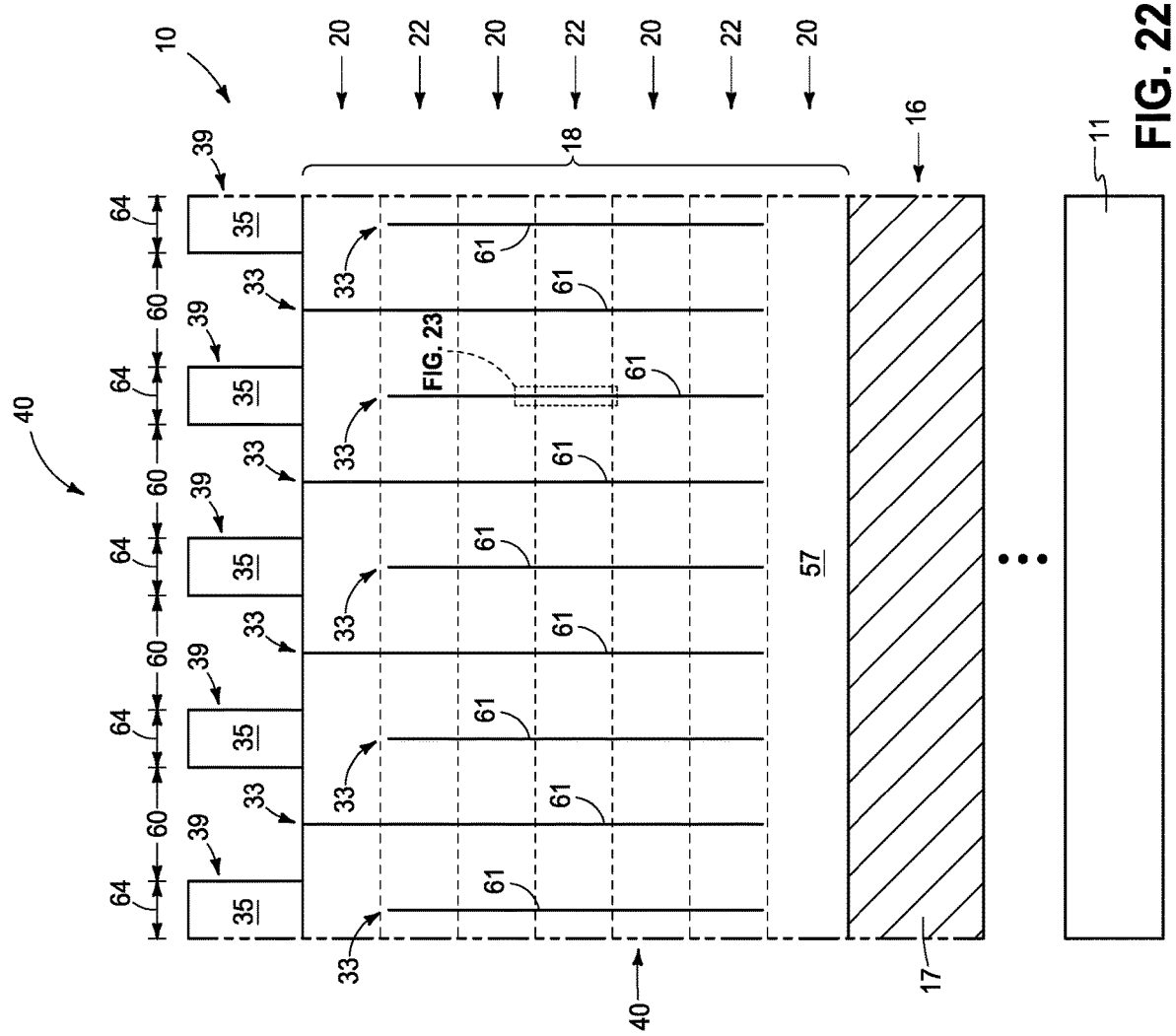

Referring to FIGS. 19-23, and in one embodiment, intervening material 57 has been formed in trenches 40 directly under and longitudinally-between bridges 39 between immediately-laterally-adjacent memory-block regions 58. FIG. 22 is at a scale three-times enlarged to that of FIGS. 19-21 for clarity, and FIG. 23 is a diagrammatic enlargement of a portion of FIG. 22. Intervening material 57 may provide lateral electrical isolation (insulation) between immediately-laterally-adjacent memory-block regions 58 and ultimate memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In one embodiment, intervening material 57 comprises a laterally-outermost insulative material (e.g., silicon nitride and/or silicon dioxide and not shown) and a laterally-inner material (e.g., undoped polysilicon and not shown) of different composition from that of the laterally-outermost insulative material. In one such embodiment, the laterally-inner material is insulative. In one embodiment, intervening material 57 is everywhere insulative between the immediately-laterally-adjacent memory blocks.

Figure 24:
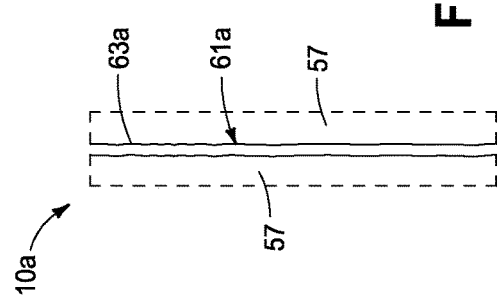
FIGS. 24-29, 32, and 33 show alternate example method and/or structural embodiments of the invention.

In one embodiment, intervening material 57 comprises a vertically-elongated seam 61 therein. In one such embodiment and as shown, vertically-elongated seam 61 is taller longitudinally-between bridges 39 than directly under bridges 39. Alternately or additionally, and as shown, vertically-elongated seam 61 has a seam top 33 (FIG. 22) that is higher longitudinally-between bridges 39 than directly under bridges 39. In one embodiment, vertically-elongated seam 61 comprises at least one void space and in one such embodiment and as shown (FIG. 23) comprises multiple vertically-spaced void spaces 63. At least some of multiple void spaces 63 individually may be vertically-elongated, for example as shown. In another example embodiment, a vertically-elongated seam 61a comprises only one void space 63a (e.g., extending downwardly from the top of intervening material 57 in trenches 40) as shown with respect to a construction 10a in FIG. 24. Like numerals from the above-described embodiments have been used where appropriate, with some construction differences being indicated with the suffix "a". Any other attribute(s) or aspect(s) as shown and/or described herein with respect to other embodiments may be used.

Figure 25:
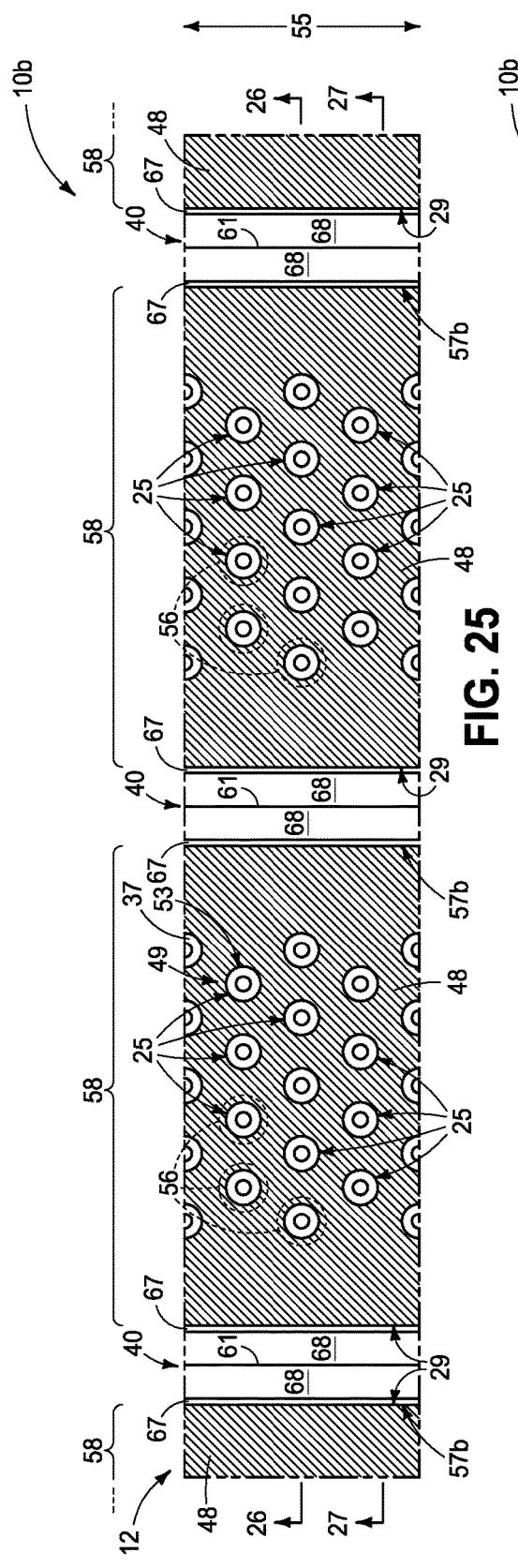
Figure 26:
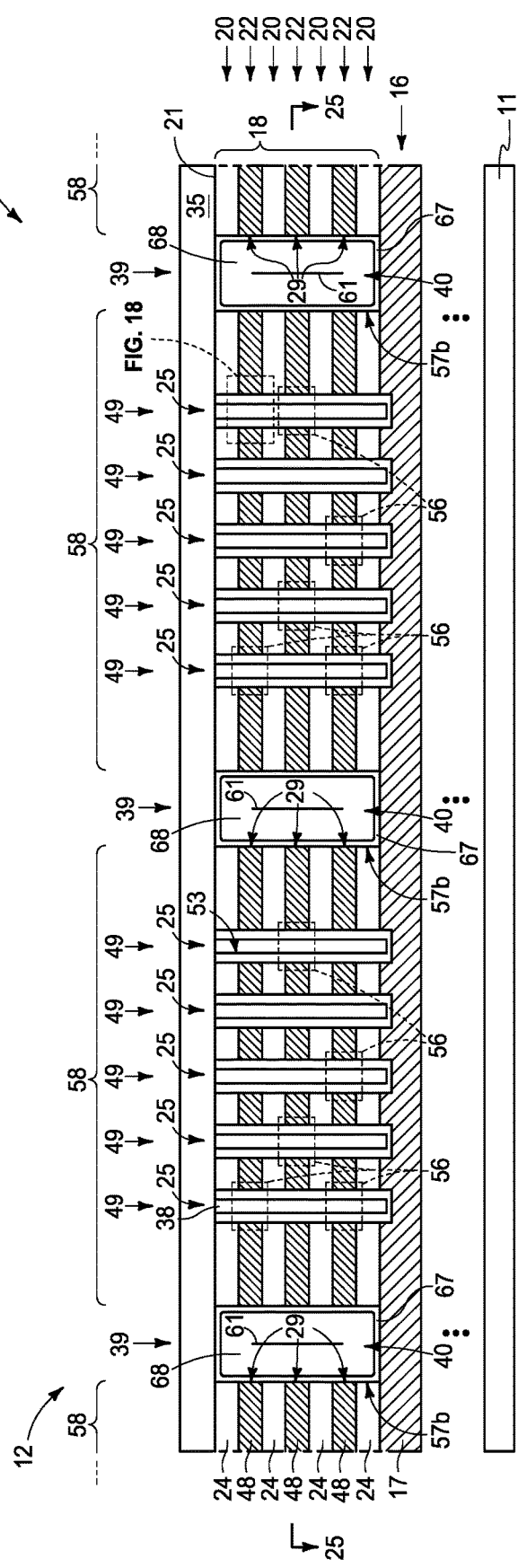
Figure 27:
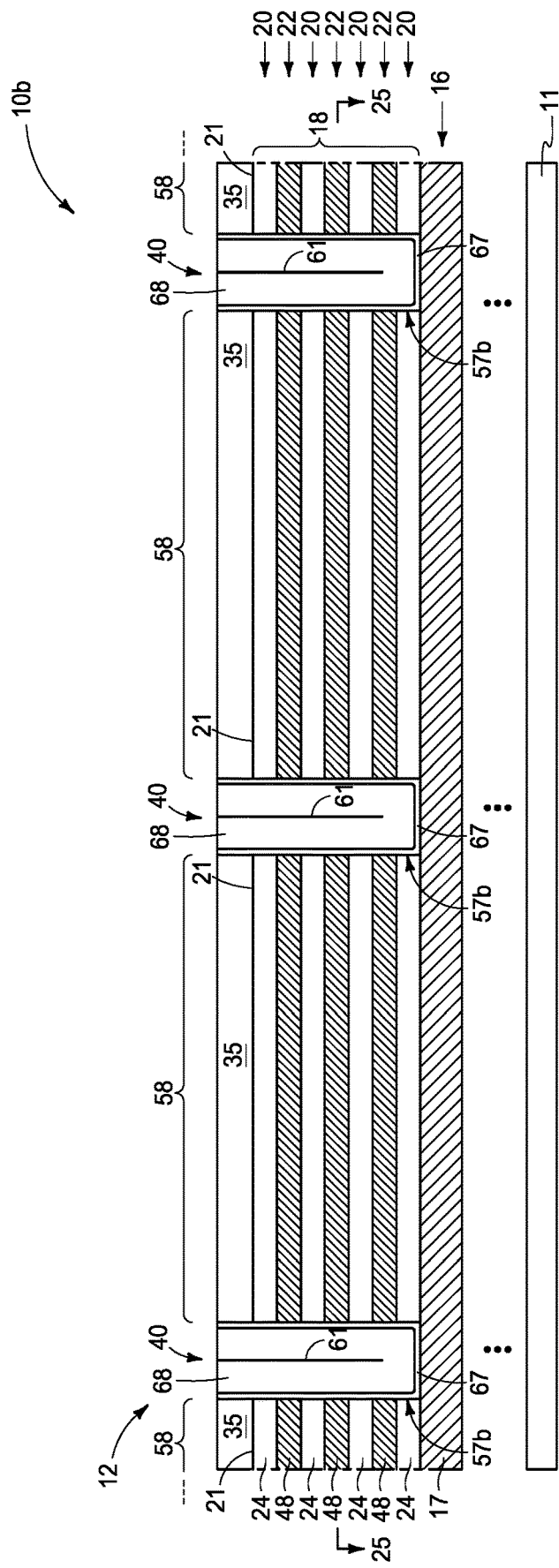

An alternate example method and resultant construction 10b are shown and described with reference FIGS. 25-27. Like numerals from the above-described embodiments have been used where appropriate, with some construction differences being indicated with the suffix "b" or with different numerals. FIGS. 25-27 show an example embodiment wherein the intervening material between the memory blocks/block regions is not homogenous. Specifically, example intervening material 57b has been formed to comprise a laterally-outer material 67 and a laterally-inner material 68 of different composition from that of laterally-outer material 67. Vertically-elongated seam 61 is in laterally-inner material 68. By way of examples only, an example laterally-outer material 67 comprises silicon dioxide and an example laterally-inner material 68 comprises undoped polysilicon.

In one embodiment where bridges 39 are insulating/insulative, at least some insulative material thereof is of the same composition as intervening material 57/57b, In one embodiment where bridges 39 are insulating/insulative, at least some insulative material thereof is of different composition from that of intervening material 57/57b, and in one embodiment only some insulative material thereof is of different composition from that of intervening material 57/57b.

Any other attribute(s) or aspect(s) as shown and/or described herein with respect to other embodiments may be used.

Figure 28:
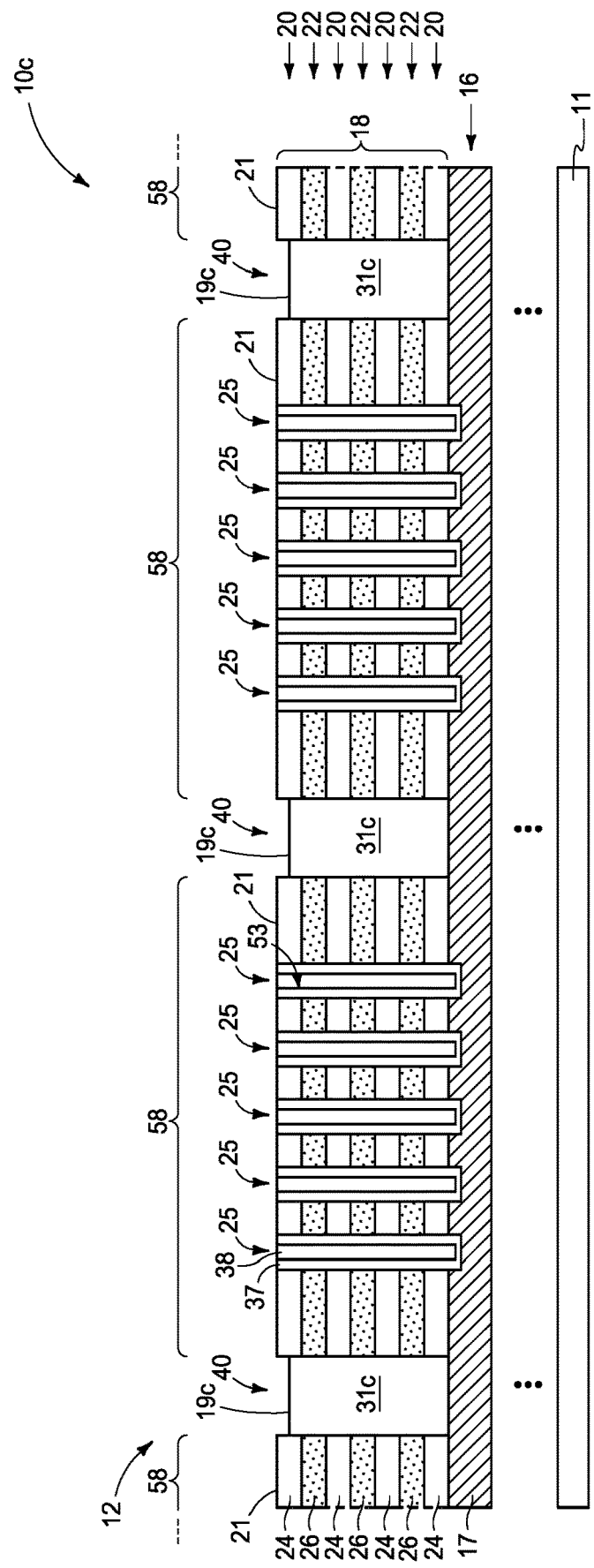
Figure 29:
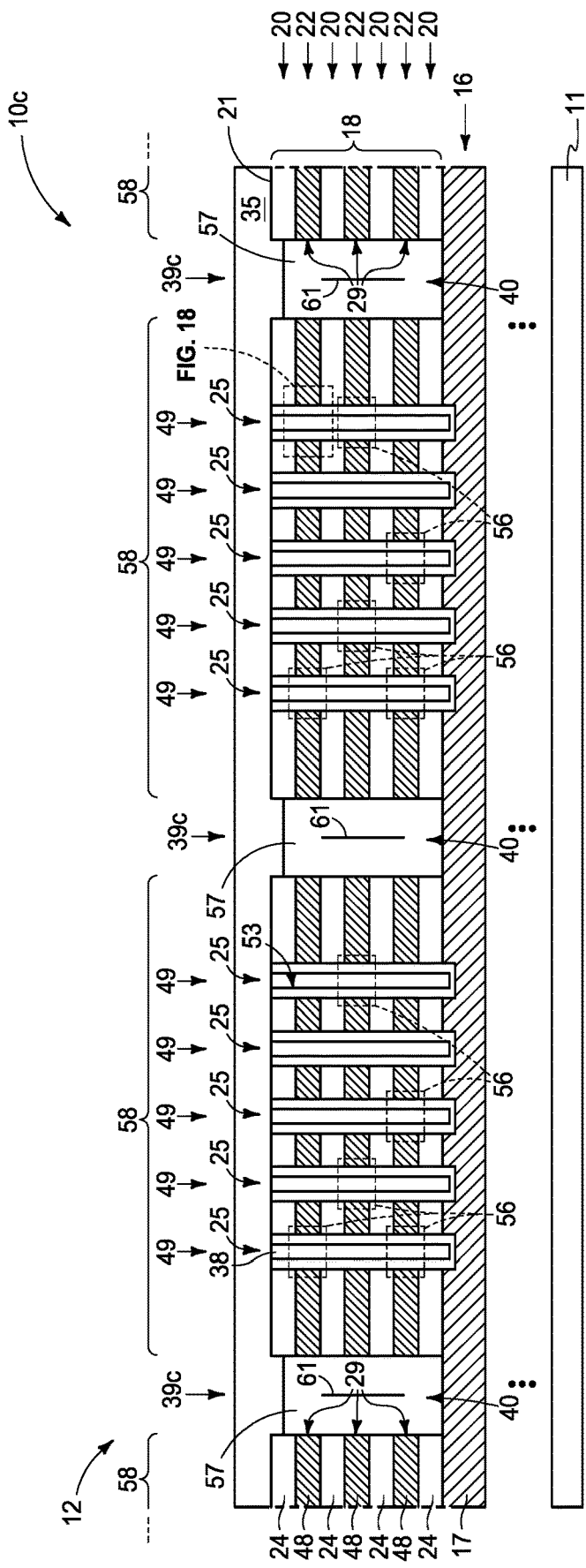

In one embodiment, all material 35 of the bridges 39 is above stack 18, for example as shown in FIGS. 19-22. An alternate example method and resultant construction 10c are shown and described with reference to FIGS. 28 and 29. Like numerals from the above-described embodiments have been used where appropriate, with some construction differences being indicated with the suffix "c". FIG. 28 most-closely analogously compares to the construction of FIG. 8 and shows an example embodiment wherein sacrificial material 31c has been formed to have a top surface 19c that is below top surface 21 of stack 18. FIG. 29 shows subsequent processing that has occurred analogous to that described above, most-closely compares to the construction of FIG. 16, and shows a slightly alternate construction of bridges 39c where some material 35 thereof is within vertical stack 18. Any other attribute(s) or aspects) as shown and/or described herein with respect to other embodiments may be used.

Figure 30:
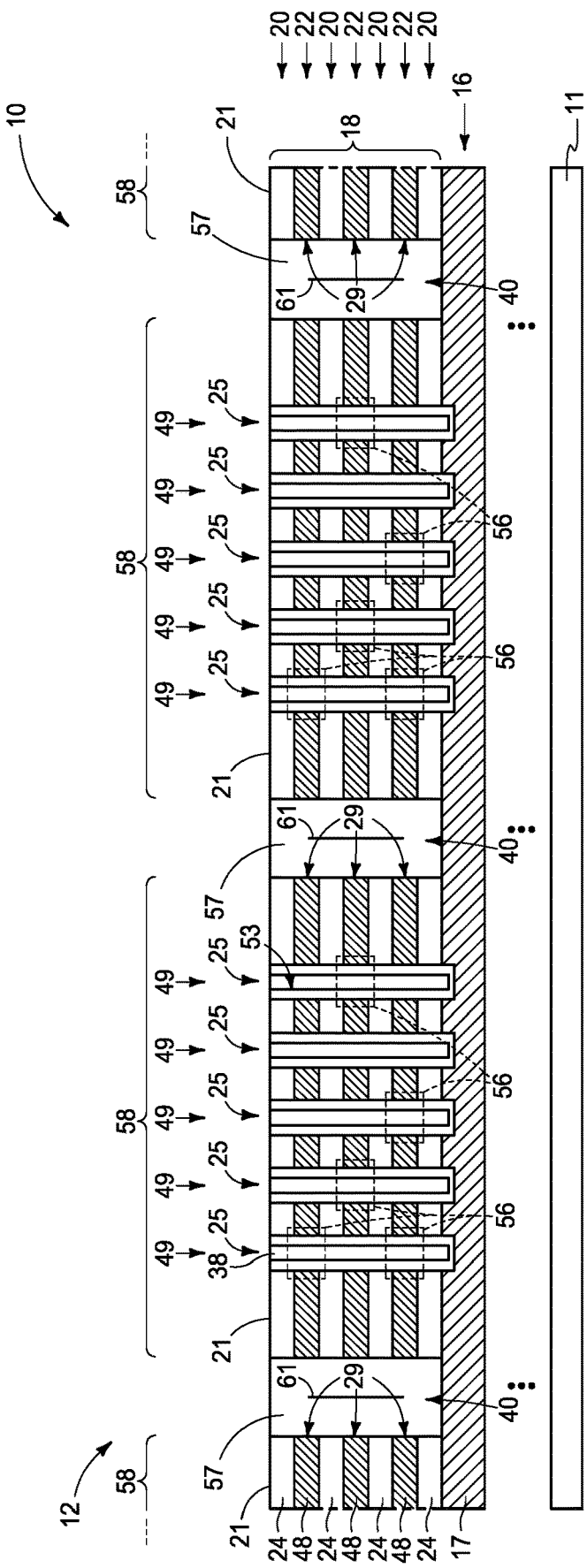
Figure 31:
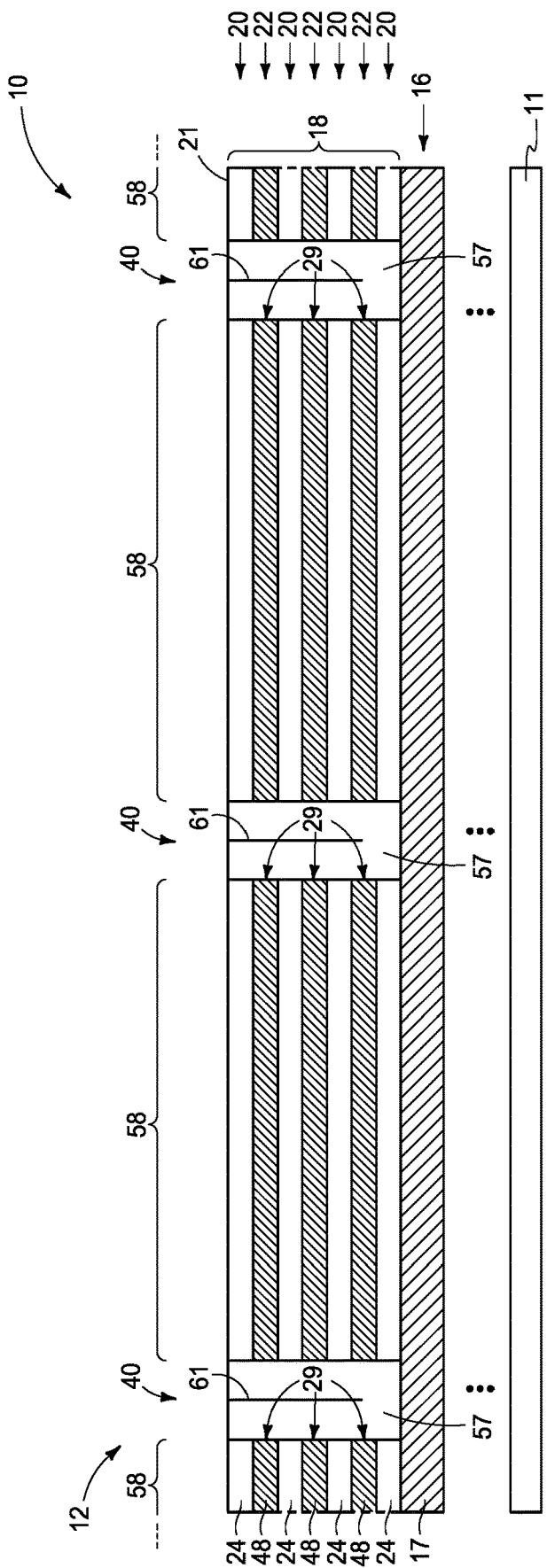
Figure 32:
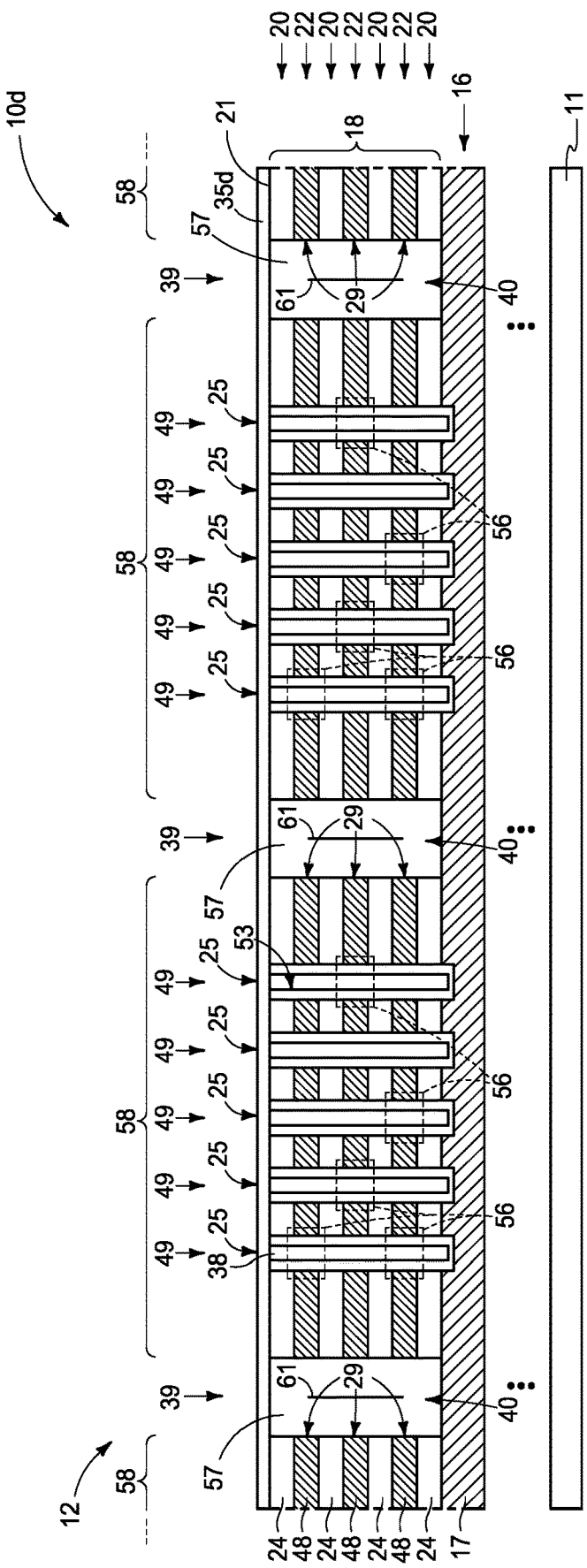
Figure 33:
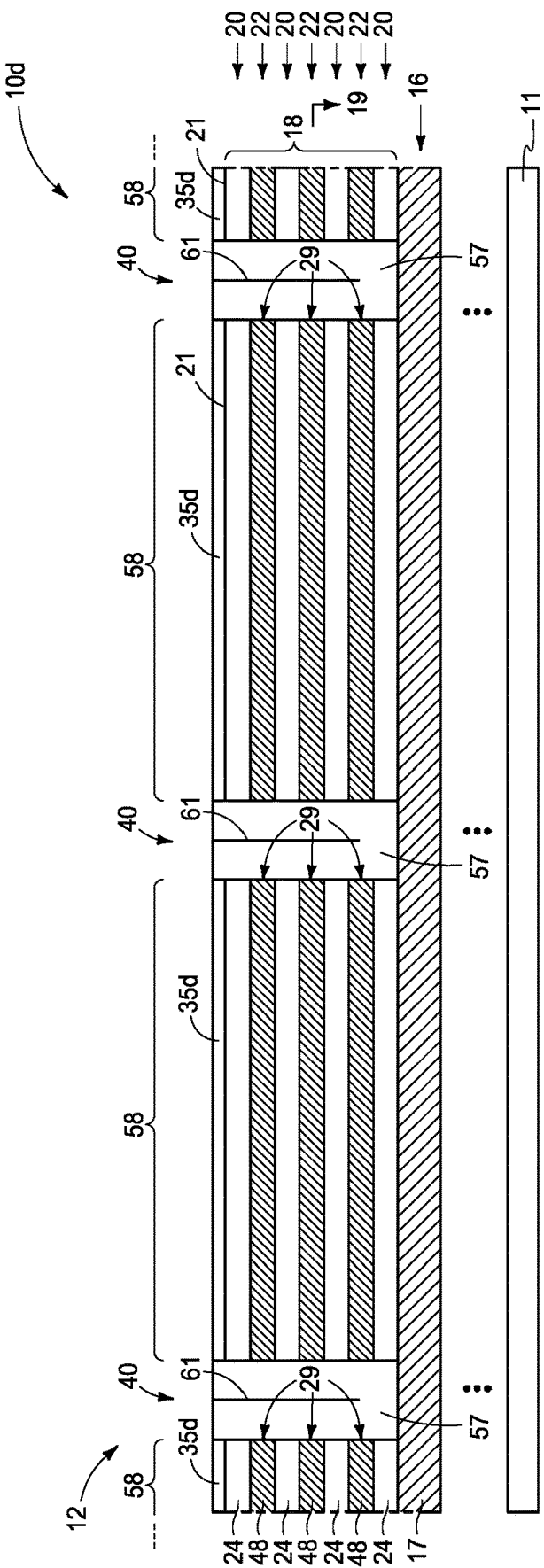

In some method embodiments, all of bridges 39/39c are removed at some time after replacing the sacrificial material in the trenches with intervening material that is directly under and longitudinally between the bridges. Example such processing is shown with respect to FIGS. 30 and 31 that is subsequent to the processing shown by FIGS. 20 and 21, respectively. Bridges 39 (not shown) of construction 10 have been removed. Alternately, at least some material of the bridges may remain extending across the trenches in a finished construction of the memory array, for example as is shown with respect to construction 10 in FIGS. 19-23 above showing essentially all bridge material 35 of bridges 39 remaining. An alternate example embodiment is shown in FIGS. 32 and 33 (corresponding to FIGS. 20 and 21, respectively) with respect to a construction 10d. Like numerals from the above-described embodiments have been used where appropriate, with some construction differences being indicated with the suffix "d". FIGS. 32 and 33 show vertical thickness of bridges 39d and material 35d (hereof having been reduced sometime after the act of forming the bridge material, and for example whereby at least some material of the bridges remains extending across the trenches in a finished construction of the memory array. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

Embodiments of the invention include a memory array (e.g., 12) comprising strings (e.g., 49) of memory cells (e.g., 56). The memory array comprises laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of memory cells extend through the insulative tiers and the conductive tiers.

In one such embodiment, intervening material (e.g., 57, 57b) is laterally-between and longitudinally-along immediately-laterally-adjacent of the memory blocks. The intervening material comprises longitudinally-alternating first and second regions (e.g., 60 and 64, respectively, in FIG. 22) individually having a vertically-elongated seam (e.g., 61, 61a) therein. The vertically-elongated seam in the first regions is taller than in the second regions. Any other attribute(s) or aspect(s) as shown and/or described herein with respect to other embodiments may be used.

In one such embodiment, intervening material (e.g., 57, 57b) is laterally-between and longitudinally-along immediately-laterally-adjacent of the memory, blocks. The intervening material comprises longitudinally-alternating first and second regions (e.g., 60 and 64, respectively, in FIG. 22) individually having a vertically-elongated seam (e.g., 61, 61a) therein. The vertically-elongated seam in the first regions has a higher top than in the second regions. Any other attribute(s) or aspect(s) as shown and/or described herein with respect to other embodiments may be used.

In one such embodiment, insulating bridges (e.g., 39, 39c, 39d) are atop the stack and extend across trenches (e.g., 40) laterally-between and longitudinally-spaced-along immediately-laterally-adjacent of the memory-block regions. Intervening material (e.g., 57, 57b) is laterally-between and longitudinally-along immediately-laterally-adjacent of the memory blocks and is directly under the insulating bridges. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45" from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be devotionally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, Or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Intervening material is laterally-between and longitudinally-along immediately-laterally-adjacent of the memory blocks. The intervening material comprises longitudinally-alternating first and second regions that individually have a vertically-elongated seam therein. The vertically-elongated seam in the first regions are taller than in the second regions.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Intervening material is laterally-between and longitudinally-along immediately-laterally-adjacent of the memory blocks. The intervening material comprises longitudinally-alternating first and second regions that individually have a vertically-elongated seam therein. The vertically-elongated seam in the first regions has a higher top than in the second regions.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Insulating bridges are atop the stack and extend laterally-between and longitudinally-spaced-along immediately-laterally-adjacent of the memory-blocks. Intervening material is laterally-between and longitudinally-along immediately-laterally-adjacent of the memory blocks and directly under the insulating bridges.

In some embodiments, a method used in forming a memory array comprising strings of memory cells comprises forming a stack comprising vertically-alternating first tiers and second tiers. Horizontally-elongated trenches are formed into the stack to form laterally-spaced memory-block regions. Sacrificial material is formed in the trenches. Bridges are formed above the stack and the sacrificial material. The bridges extend laterally-between and are longitudinally-spaced-along immediately-laterally-adjacent of the memory-block regions. The sacrificial material is replaced in the trenches with intervening material that is directly under and longitudinally-between the bridges.

In some embodiments, a method used in forming a memory array comprising strings of memory cells comprises forming a stack comprising vertically-alternating first tiers and second tiers. The first tiers comprise first sacrificial material. Horizontally-elongated trenches are formed into the stack to form laterally-spaced memory-block regions. A second sacrificial material is formed in the trenches. Bridges are formed above the stack and the second sacrificial material. The bridges extend laterally-between and are longitudinally-spaced-along immediately-laterally-adjacent of the memory-block regions. The second sacrificial material is isotropically etched away selectively relative to the bridges and the second tiers. The first sacrificial material that is in the first tiers is isotropically etched away and replaced with conducting material of individual conductive lines. Intervening material is formed in the trenches directly under and longitudinally-between the bridges between the immediately-laterally-adjacent memory-block regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a stack comprising vertically-alternating first tiers and second tiers;
    forming horizontally-elongated trenches into the stack to form laterally-spaced memory-block regions;
    forming sacrificial material in the trenches;
    forming bridges above the stack and the sacrificial material, the bridges extending across the trenches laterally-between and longitudinally-spaced-along immediately-laterally-adjacent of the memory-block regions; and
    replacing the sacrificial material in the trenches with intervening material that is directly under and longitudinally-between the bridges.

2. The method of claim 1 wherein material of the bridges is atop and extends laterally all across individual of the memory-block regions during the replacing.

3. The method of claim 2 wherein the material of the bridges covers all of tops of the memory-block regions during the replacing.

4. The method of claim 1 comprising forming the sacrificial material to have a top surface that is elevationally coincident with a top surface of the stack.

5. The method of claim 1 comprising forming the sacrificial material to have a top surface that is below a top surface of the stack.

6. The method of claim 1 comprising forming the sacrificial material and the stack to individually have a top surface that is planar.

7. The method of claim 6 comprising forming the top surfaces of the sacrificial material and the stack to be co-planar.

8. The method of claim 1 wherein material of the bridges is directly against and of the same composition as insulative material of a top insulative second tier of the stack.

9. The method of claim 1 wherein material of the bridges is of different composition of all material of the vertically-alternating first tiers and second tiers.

10. The method of claim 9 wherein the bridge material comprises carbon-doped silicon nitride.

11. The method of claim 1 comprising removing all of the bridges after the replacing.

12. The method of claim 1 wherein at least some material of the bridges remains extending across the trenches in a finished construction of the memory array.

13. The method of claim 12 comprising reducing vertical thickness of the bridges after the replacing.

14. The method of claim 1 comprising forming the sacrificial material to comprise at least one of spin-on-carbon, boron and/or phosphorous doped silicon dioxide, aluminum oxide, and elemental-form tungsten.

15. The method of claim 1 comprising forming individual memory cells of the strings of memory cells to comprise channel material of operative channel-material strings, a gate region that is part of a conductive line in individual of the first tiers, and a memory structure laterally-between the gate region and the channel material of the operative channel-material strings in the individual first tiers, conducting material of the first tiers being formed after forming the bridges.

16. The method of claim 1 comprising forming individual memory cells of the strings of memory cells to comprise channel material of operative channel-material strings, a gate region that is part of a conductive line in individual of the first tiers, and a memory structure laterally-between the gate region and the channel material of the operative channel-material strings in the individual first tiers, conducting material of the first tiers being formed before forming the bridges.

17. A method used in forming a memory array comprising strings of memory cells, comprising:
    forming a stack comprising vertically-alternating first tiers and second tiers, the first tiers comprising first sacrificial material;
    forming horizontally-elongated trenches into the stack to form laterally-spaced memory-block regions;
    forming second sacrificial material in the trenches;
    forming bridges above the stack and the second sacrificial material, the bridges extending across the trenches laterally-between and longitudinally-spaced-along immediately-laterally-adjacent of the memory-block regions;
    isotropically etching away the second sacrificial material selectively relative to the bridges and the second tiers;
    isotropically etching away and replacing the first sacrificial material that is in the first tiers with conducting material of individual conductive lines; and
    forming intervening material in the trenches directly under and longitudinally-between the bridges between the immediately-laterally-adjacent memory-block regions.

18. The method of claim 17 wherein the first and second sacrificial materials are of different compositions relative one another.

19. The method of claim 17 wherein the first and second sacrificial materials are of the same composition relative one another.

20. The method of claim 17 wherein the isotropically etching away the second sacrificial material selectively relative to the bridges and the second tiers is also conducted selectively relative to the first tiers.

\* \* \* \* \*